United States Patent
Goyal et al.

(10) Patent No.: US 8,910,099 B1
(45) Date of Patent: Dec. 9, 2014

(54) METHOD FOR DEBUGGING UNREACHABLE DESIGN TARGETS DETECTED BY FORMAL VERIFICATION

(71) Applicant: Cadence Design Systems, Inc., San Jose, CA (US)

(72) Inventors: Pradeep Goyal, Uttar Pradesh (IN); Alok Jain, New Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/197,887

(22) Filed: Mar. 5, 2014

(51) Int. Cl.
*G06F 17/50* (2006.01)

(52) U.S. Cl.
CPC .................................. *G06F 17/5081* (2013.01)
USPC .......................................... 716/112; 716/113

(58) Field of Classification Search
USPC .................................................. 716/110–116
See application file for complete search history.

(56) References Cited

U.S. PATENT DOCUMENTS

| | | | |
|---|---|---|---|
| 8,079,000 B2 * | 12/2011 | Koelbl et al. | 716/104 |
| 8,316,332 B1 | 11/2012 | Goyal et al. | |
| 2001/0010090 A1 * | 7/2001 | Boyle et al. | 716/2 |
| 2006/0190869 A1 * | 8/2006 | Baumgartner et al. | 716/5 |

* cited by examiner

*Primary Examiner* — Binh Tat
(74) *Attorney, Agent, or Firm* — Holland & Knight LLP; Mark H. Whittenberger, Esq.

(57) ABSTRACT

The present disclosure relates to a method for debugging in the formal verification of an integrated circuit design. The method may include providing, via a computing device, an electronic design associated with the integrated circuit. Embodiments may further include splitting one or more nets in a cone of influence of a target associated with the electronic design. For each split net, embodiments may include placing a constraint that re-joins the net. Embodiments may also include identifying a local region of the electronic design for which the target is unreachable. During formal verification, embodiments may include ignoring all constraints associated with the local region of the electronic design.

15 Claims, 15 Drawing Sheets

Simulation

Formal Verification
(In Practice)

METHOD FOR DEBUGGING UNREACHABLE DESIGN TARGETS DETECTED BY FORMAL VERIFICATION

FIELD OF THE INVENTION

The embodiments of the present disclosure relate to a method of formal verification, and more particularly, to a method of debugging during formal verification.

BACKGROUND

In general, it may be desirable to identify errors in semiconductor design while the semiconductor is in the design phase. As production moves from design to tooling and fabrication, the cost to fix design errors increases greatly. This great increase in cost may be attributable to specialized fabrication hardware that may have to be modified to repair a design error. A very small change in design can have cascading effects to other areas of the semiconductor. If these changes are made in while the semiconductor is in the design phase, software design tools can simply modify the architecture appropriately with little ramifications. If, however, a design error is found after production has transitioned to tooling and fabrication, a design change with cascading effects could necessitate the retooling of the entire line at considerable cost.

As design errors are much less costly to remedy while the semiconductor is in the design phase, much effort has been expended into methods of ensuring proper semiconductor designs in this stage. The process of ensuring proper design is referred to as verification. Design verification is generally focused into two areas: simulation and formal verification. Simulation involves testing the design against a sample set of inputs and checking the outputs against their expected values. Formal verification involves testing the universe of possible inputs against their expected outputs.

SUMMARY

Accordingly, an embodiment of the present disclosure is directed to a computer-implemented method for debugging in a formal verification of an integrated circuit. In some embodiments, the method may include providing, via a computing device, an electronic design associated with the integrated circuit. Embodiments may further include splitting one or more nets in a cone of influence of a target associated with the electronic design. For each split net, embodiments may include placing a constraint that re-joins the net. Embodiments may also include identifying a local region of the electronic design for which the target is unreachable. During formal verification, embodiments may include ignoring all constraints associated with the local region of the electronic design.

One or more of the following features may be included. The method may further include obtaining an unisolated list of constraints initially comprising all known constraints for the integrated circuit design. The method may also include obtaining an isolated list of constraints initially comprising none of the known constraints. The method may further include attempting to prove an assertion without the known constraints. The method may also include determining if the assertion is valid. The method may further include updating the isolated list of constraints. The method may also include adding the first constraint to the isolated list to generate an updated isolated list and removing the first constraint from the unisolated list. The method may additionally include proving the assertion with the updated isolated list and reporting one or more of a passing or a failing assertion. The method may further include isolating additional constraints using multiple iterations of the computer-implemented method.

In another embodiment of the present disclosure a computer-readable storage medium having stored thereon instructions, which when executed by a processor result in a number of operations is provided. Operations may include providing, via a computing device, an electronic design associated with the integrated circuit. Operations may further include splitting one or more nets in a cone of influence of a target associated with the electronic design. For each split net, embodiments may include placing a constraint that re-joins the net. Operations may also include identifying a local region of the electronic design for which the target is unreachable. During formal verification, embodiments may include ignoring all constraints associated with the local region of the electronic design.

One or more of the following features may be included. The operations may further include obtaining an unisolated list of constraints initially comprising all known constraints for the integrated circuit design. Operations may also include obtaining an isolated list of constraints initially comprising none of the known constraints. Operations may further include attempting to prove an assertion without the known constraints. Operations may also include determining if the assertion is valid. Operations may further include updating the isolated list of constraints. Operations may also include adding the first constraint to the isolated list to generate an updated isolated list and removing the first constraint from the unisolated list. Operations may additionally include proving the assertion with the updated isolated list and reporting one or more of a passing or a failing assertion. Operations may further include isolating additional constraints using multiple iterations of the computer-implemented method.

In yet another embodiment of the present disclosure a computing system for debugging in a formal verification of an integrated circuit is provided. In some embodiments the computing system may include at least one processor, at least one memory architecture coupled with the at least one processor and a first software module executed by the at least one processor, wherein the first software module is configured to provide an electronic design associated with the integrated circuit. The computing system may further include a second software module executed by the at least one processor, wherein the second software module is configured to split one or more nets in a cone of influence of a target associated with the electronic design. The computing system may further include a third software module executed by the at least one processor, wherein the third software module is configured to, for each split net, place a constraint that re-joins the net. The computing system may further include a fourth software module executed by the at least one processor, wherein the fourth software module is configured to identify a local region of the electronic design for which the target is unreachable. The computing system may further include a fifth software module executed by the at least one processor, wherein the fifth software module is configured to, during formal verification, ignore all constraints associated with the local region of the electronic design.

One or more of the following features may be included. The computing system may further include a sixth software module executed by the at least one processor, wherein the sixth software module is configured to obtain an unisolated list of constraints initially comprising all known constraints for the integrated circuit design.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
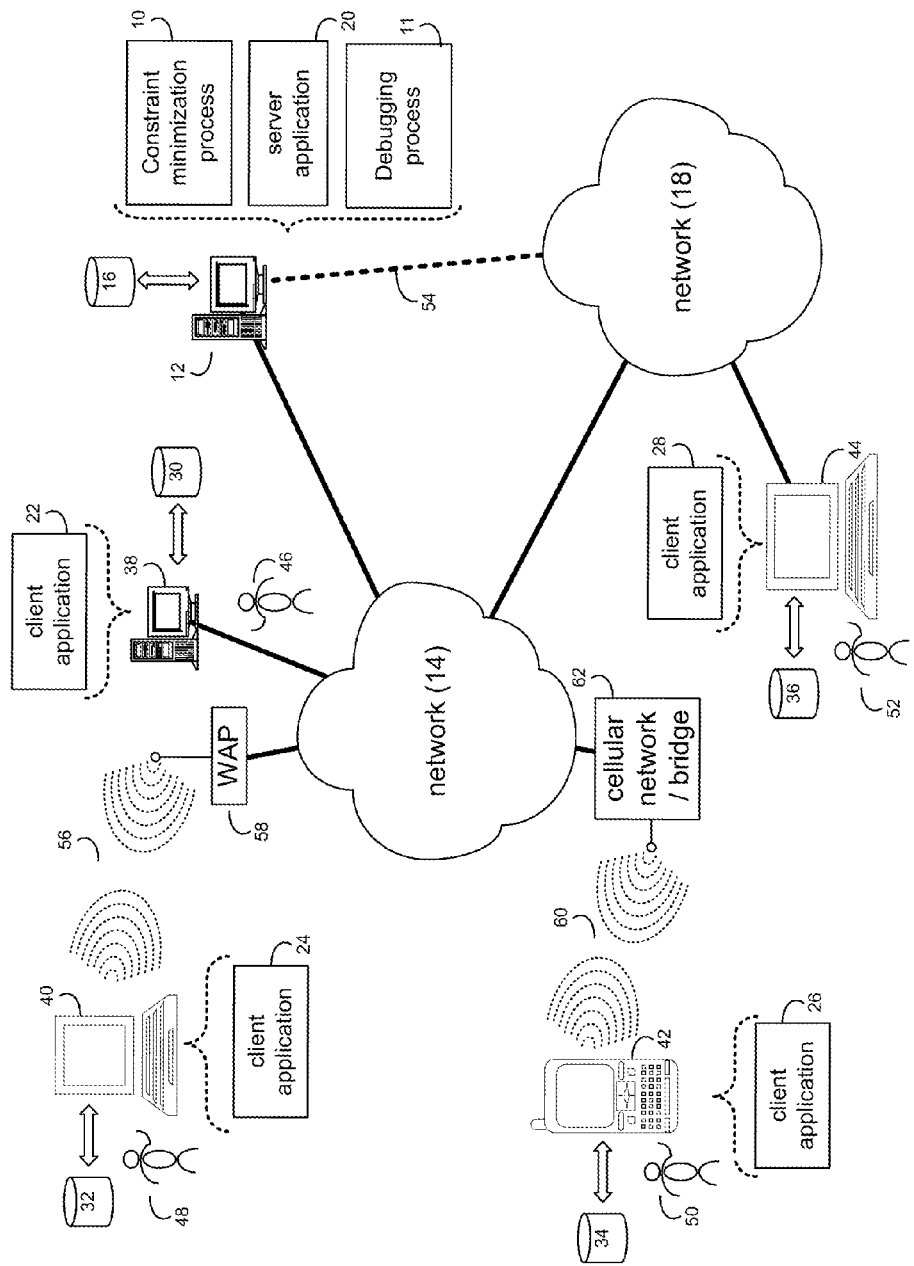
FIG. 1 diagrammatically depicts an automatic constraint minimization process coupled to a distributed computing network.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings denote like elements.

SYSTEM OVERVIEW

Referring to FIG. 1, there is shown constraint minimization process 10 and debugging process 11 that may reside on and may be executed by server computer 12, which may be connected to network 14 (e.g., the internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft Windows XP Server™; Novell Netware™; or Redhat Linux™, for example. Additionally and/or alternatively, the constraint minimization process and debugging process 11 may reside on a client electronic device, such as a personal computer, notebook computer, personal digital assistant, or the like.

As will be discussed below in greater detail, constraint minimization process 10 may be used to minimize the number of constraints required for formal verification of an integrated circuit design. In this way, the present disclosure may be used to detect a reduced list of constraints that may be functionally required to verify a particular assertion. The methods described herein may utilize a variety of techniques, including, but not limited to, constraint solving and dead-end detection.

As is also discussed below, debugging process 11 may be configured to debug an unreachable design target detected by formal verification. These targets may be unreachable because of a particular design bug. In order to understand and fix the design bug, embodiments disclosed herein may provide information to the user that may assist in the debugging process.

The instruction sets and subroutines of constraint minimization process 10 and debugging process 11, which may be stored on storage device 16 coupled to server computer 12, may be executed by one or more processors (not shown) and one or more memory architectures (not shown) incorporated into server computer 12. Storage device 16 may include but is not limited to: a hard disk drive; a tape drive; an optical drive; a RAID array; a random access memory (RAM); and a read-only memory (ROM).

Server computer 12 may execute a web server application, examples of which may include but are not limited to: Microsoft IIS™, Novell Webserver™, or Apache Webserver™, that allows for HTTP (i.e., HyperText Transfer Protocol) access to server computer 12 via network 14. Network 14 may be connected to one or more secondary networks (e.g., network 18), examples of which may include but are not limited to: a local area network; a wide area network; or an intranet, for example.

Server computer 12 may execute one or more server applications (e.g., server application 20), examples of which may include but are not limited to, e.g., Lotus Domino™ Server and Microsoft Exchange™ Server. Server application 20 may interact with one or more client applications (e.g., client applications 22, 24, 26, 28) in order to execute constraint minimization process 10 and/or debugging process 11. Examples of client applications 22, 24, 26, 28 may include, but are not limited to, design verification tools such as those available from the assignee of the present disclosure. These applications may also be executed by server computer 12. In some embodiments, constraint minimization process 10 and/or debugging process 11 may be a stand-alone application that interfaces with server application 20 or may be an applet/application that is executed within server application 20.

The instruction sets and subroutines of server application 20, which may be stored on storage device 16 coupled to server computer 12, may be executed by one or more processors (not shown) and one or more memory architectures (not shown) incorporated into server computer 12.

As mentioned above, in addition/as an alternative to being a server-based application residing on server computer 12, the constraint minimization process and/or debugging process 11 may be a client-side application (not shown) residing on one or more client electronic devices 38, 40, 42, 44 (e.g., stored on storage devices 30, 32, 34, 36, respectively). As such, the constraint minimization process and/or debugging process 11 may be a stand-alone application that interfaces with a client application (e.g., client applications 22, 24, 26, 28), or may be an applet/application that is executed within a client application. As such, the constraint minimization process and/or debugging process 11 may be a client-side process, a server-side process, or a hybrid client-side/server-side process, which may be executed, in whole or in part, by server computer 12, or one or more of client electronic devices 38, 40, 42, 44.

The instruction sets and subroutines of client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory architectures (not shown) incorporated into client electronic devices 38, 40, 42, 44 (respectively). Storage devices 30, 32, 34, 36 may include but are not limited to: hard disk drives; tape drives; optical drives; RAID arrays; random access memories (RAM); read-only memories (ROM), compact flash (CF) storage devices, secure digital (SD) storage devices, and memory stick storage devices. Examples of client electronic devices 38, 40, 42, 44 may include, but are not limited to, personal computer 38, laptop computer 40, personal digital assistant 42, notebook computer 44, a data-enabled, cellular telephone (not shown), and a dedicated network device (not shown), for example. Using client applications 22, 24, 26, 28, users 46, 48, 50, 52 may utilize formal analysis, testbench simulation, and/or hybrid technology features verify a particular integrated circuit design.

Users 46, 48, 50, 52 may access server application 20 directly through the device on which the client application (e.g., client applications 22, 24, 26, 28) is executed, namely client electronic devices 38, 40, 42, 44, for example. Users 46, 48, 50, 52 may access server application 20 directly through network 14 or through secondary network 18. Further, server computer 12 (e.g., the computer that executes server application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, Wi-Fi, and/or Bluetooth device that is capable of establishing wireless communication channel 56 between laptop computer 40 and WAP 58. Personal digital assistant 42 is shown wirelessly coupled to network 14 via wireless communication channel 60 established between personal digital assistant 42 and cellular network/bridge 62, which is shown directly coupled to network 14.

As is known in the art, all of the IEEE 802.11x specifications may use Ethernet protocol and carrier sense multiple access with collision avoidance (CSMA/CA) for path sharing. The various 802.11x specifications may use phase-shift keying (PSK) modulation or complementary code keying (CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows™, Microsoft Windows CE™, Redhat Linux™, or a custom operating system.

Constraint Minimization and Debugging Processes

The term "constraint" as used herein, may refer to a condition that may limit the set of behaviors to be considered. A constraint may represent real requirements (e.g., clocking requirements) on the environment in which the design is used, or it may represent artificial limitations (e.g. mode settings) imposed in order to partition the verification task.

The term "assertion" as used herein, may refer to a statement that a given property is required to hold and/or a directive to verification tools to verify that it does hold.

The term "design" as used herein, may refer to a model of a piece of hardware, which may be described in a hardware description language. A design may typically involve a collection of inputs, outputs, state elements, and combinational functions that compute next state and outputs from current state and outputs.

For illustrative purposes client application 22 will be discussed. However, this should not be construed as a limitation of the present disclosure, as other client applications (e.g., client applications 24, 26, 28) may be equally utilized.

Figure 2:
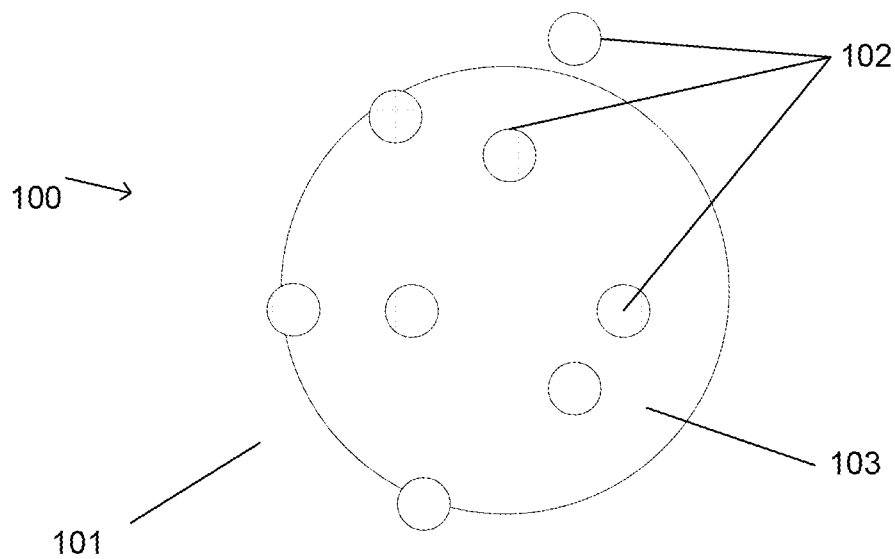
FIG. 2 is an illustration of a simulation method in accordance with the present disclosure.

FIG. 2 is an illustration of a simulation method in accordance with the present disclosure. Referring to FIG. 2, a simulation verification method 100 may need to be tested over a universe 101 of possible test points. Testing of the simulation verification method 100 may be performed on a particular area of the universe 101, for example the cross-hatched area 102. A portion of the universe 101 may be left untested, for example the untested area 103.

In simulation 100, only small portions 102 of the universe 101 may be tested. These small tested portions 102 may represent exemplary inputs to test particular functionality of a device under verification. Simulation may often be a desirable method of verification as it may be comparatively less time intensive than formal verification. However, simulation leaves certain portions of the universe 101 untested 103.

Figure 3:
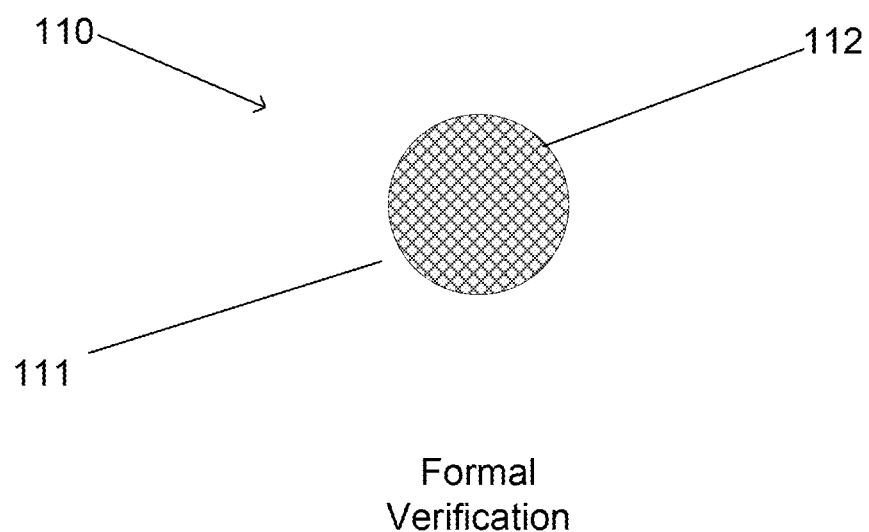
FIG. 3 is an illustration of a formal verification method according to the present disclosure.

FIG. 3 is an illustration of a formal verification method according to the present disclosure. Referring to FIG. 3, a formal verification method 110 may be applied to a universe 111 of possible test points. As shown in FIG. 3, the tested portion 112 depicted by the crossed hatched area represents the entire universe 111 of possible test points.

In formal verification 110, all portions 112 of the universe 111 may be tested. If a device passes formal verification it is proven to conform to the specification. Generally, no areas are left untested. Formal verification is often a desirable method of verification as the result is mathematical certainty that a design conforms to the specification. However, formal verification may often take much longer than simulation and can result in testing of invalid input combinations that can cause erroneous behavior. For example, the formal verification of an adder having two eight-bit inputs and an eight-bit output would produce erroneous results in the case of an overflow. However, if this adder were implemented in a device constrained such that the inputs never exceeded seven bits, this problem would not occur.

Formal verification may include both design style and capacity limitations. In terms of design styles, formal verification generally may only handle the synthesizable subset of hardware description languages (HDL). Simulation on the other hand can handle both synthesizable and non-synthesizable constructs. Formal verification may also have severe capacity limitations. As formal verification is an exhaustive procedure, it is typically limited to block-level design verification. Simulation may be better suited for arbitrary large chip and system on chip designs.

Figure 4:
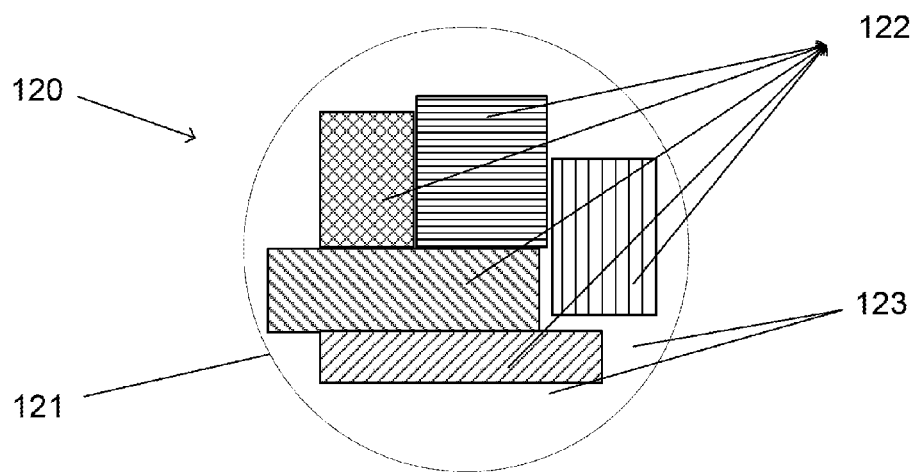
FIG. 4 is another illustration of a formal verification method according to the present disclosure.

FIG. 4 is another illustration of a formal verification method according to the present disclosure. As shown in FIG. 4, a design may be subjected to formal verification over a broad range of inputs 122 within the universe 121. Small areas 123 are left untested. The untested areas 123 could represent impossible combinations of inputs for which there is no need to test or invalid inputs which cause erroneous behavior in the design under test.

For example, on a ten-button device where each button is sequentially encoded with a four-bit number, an impossible input would be a four-bit encoding for which no button exists. Given that it is likely the designers did not consider this impossible contingency, such an input could cause non-deterministic behavior and possibly lead to an error state or a dead end.

The term "dead end" as used herein, may refer to a state for which there is no solution for the inputs. In this particular case, while formal verification would be possible for a theoretical button eleven, it would be unnecessary to do so. Such a restriction upon the range of inputs during formal verification is called a constraint. Constraints can also be placed on the outputs as well as internal nets.

Referring again to FIG. 4, the area 123 can represent an area defined by a set of constraints. Formal verification may then be performed over area 122. However, the area 123 may represent limitations defined by many constraints, some of which may be unnecessary for the successful formal verification of the design. It is possible that some constraints that define the area 123 could be removed, thereby expanding the area defined by 122. If formal verification of the design passes over an expanded area 122, then formal verification could be expected to pass over the original area 122 and the removed constraint was unnecessary. Removing the unnecessary constraints may reduce the processing time required to ensure the remaining constraints are not violated and may reduce the time to complete formal verification.

One method of formal verification is assertion based verification (ABV). In ABV, a design can be verified by proving that a certain set of assertions is always true. In the example of the eight-bit adder described above, an assertion that verifies the proper function of the adder might specify that the most significant bit of either input is never ONE. If this assertion holds true through formal verification, it can be assured that an overflow condition at output of the adder will not occur. At this point it should be possible to see that it is unlikely that the adder will pass formal verification as the adder has two eight-bit inputs and nothing apparent to limit the inputs to seven-bit numbers. Accordingly, some set of constraints which limits the input to the adder is necessary so that the assertion is not activated.

Figure 5:
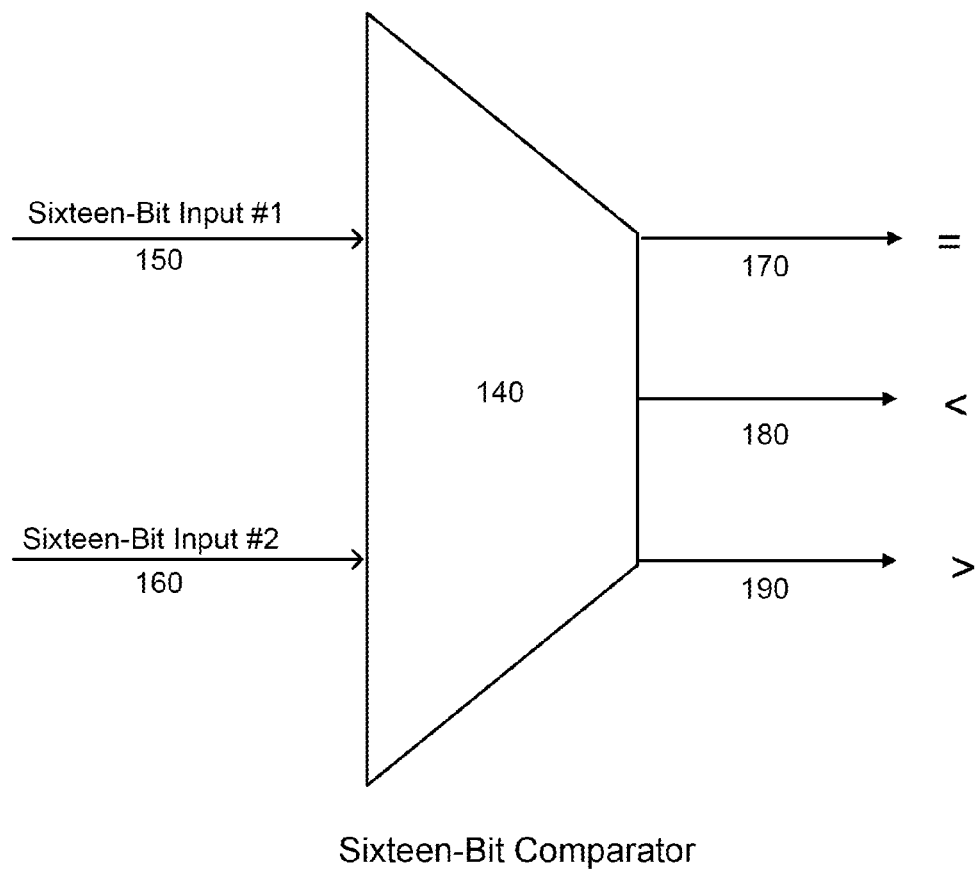
FIG. 5 is a logical block diagram of a sixteen-bit comparator.

Referring now to FIG. 5 a logical block diagram of a sixteen-bit comparator is provided. As shown in FIG. 5 a sixteen-bit comparator 140 may include a first sixteen-bit input 150, a second sixteen-bit input 160, and three outputs 170, 180, and 190 indicating equal to, less than, or greater than, respectively.

When the first input 150 is equal to the second input 160, the output 170 may be HIGH and outputs 180 and 190 may be LOW. When the first input 150 is less than the second input 160, the output 180 may be HIGH and the remaining outputs 170 and 190 may be LOW. When the first input 150 is greater than the second input 160, the output 190 may be HIGH and the remaining outputs 170 and 180 may be LOW.

To fully verify the sixteen-bit comparator shown in FIG. 5 through exhaustive simulation, every possible combination of sixteen-bit input vectors would need to be tested. If each combination could be tested in one microsecond, and there are $2^{16}*2^{16}$ combinations, exhaustive simulation for this simple component could take over an hour. In modern 32-bit and 64-bit systems the time complexity to exhaustively verify a component increases exponentially to thousands of years. Using an assertion, the same verification could be completed in less than a minute.

Constraints for formal verification may be chosen using structural cone of influence analysis of the assertion and the constraints. The phrase "cone of influence" as used herein, may refer to all of the nets that are part of the transitive fanin traversal of the net. In other words, by performing the transitive fanin transversal the cone of influence may be obtained. For example, if a net "out=a & b" then "a" and "b" may be in the cone of influence of "out". In order to identify the cone of influence of an assertion or constraint, obtain the nets on which the assertion or the constraint is written and perform transitive fanin traversal of those nets. All of the nets that are part of this traversal are considered as in the cone of influence of the nets. A constraint is considered important to an assertion if the cone of influence of the constraint intersects with the cones of influence of the assertion. A list of necessary constraints can be obtained by iterating over the list of constraints and finding overlap between their respective cones of influence.

The problem with existing structural cone of influence analysis is that even a small intersection of nets results in picking up the constraint. For example, clock or reset nets are common in almost all the constraints and assertions. In these cases all the constraints may be picked up for verification of the assertion. This limitation can be avoided by marking the clock and reset nets as "ignore" nets. An ignore net means that a constraint may not be identified if the only net intersecting the cones of influence of the assertion is the ignore net. The ignore technique can work effectively if extra constraints are picked up because of a global net such as clock or reset.

In practical examples, there may be situations where extra constraints are picked up because of a local internal net in the design. Such an example is the case of a power shutoff where one clock domain deliberately shuts off another clock domain. In this case, an ignore technique does not work. Additionally, the ignore approach sometimes results in false positives where necessary constraints are not added because nets were marked as ignore. Further, this technique has not been shown to significantly reduce the number of constraints.

ABV has capacity and performance limitations because of the set of constraints. Designs that use ABV may have constraints on inputs, outputs and internal nets. A large set of constraints can add significant complexity to the task of formal verification. The modeling of constraints can require auxiliary code to be written which can include a large portion of the device under test in the cone of influence of the assertion being verified. This in turn may increase the complexity of the verification.

Figure 6:
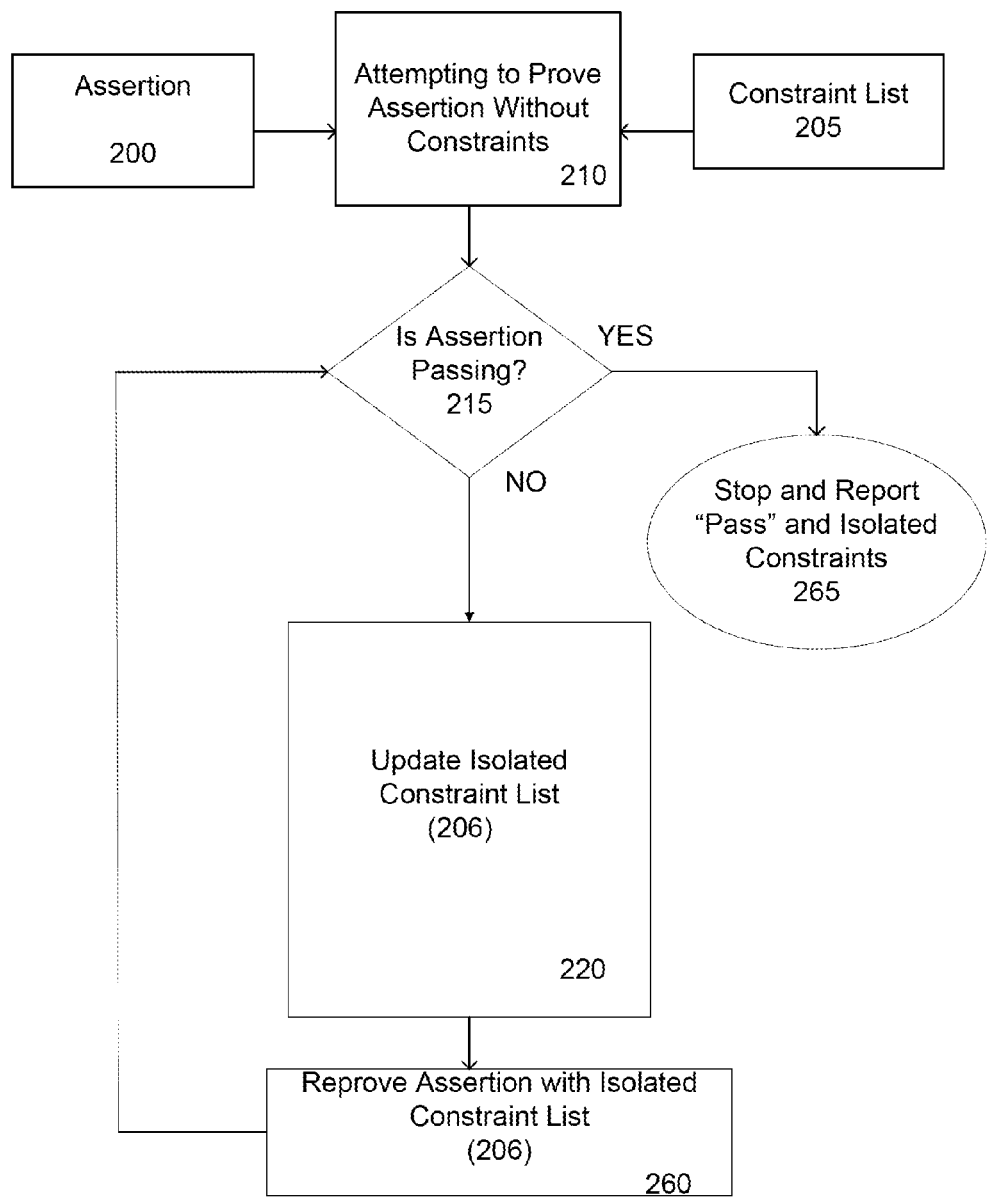
FIG. 6 is an exemplary flowchart of a method of performing formal verification according to an embodiment of the present disclosure.

Referring now to FIG. 6, an exemplary flowchart of a method of performing formal verification according to an embodiment of the present disclosure is provided. As shown in FIG. 6, a method of performing formal verification may include attempting 210 to prove an assertion 200 without a list of constraints 205, determining 215 if the assertion passed or is valid, updating 220 a list of isolated constraints 206, and reproving 260 the assertion with the isolated constraint list 206. It should be appreciated that the list of constraints 205 are unisolated and, the unisolated list of constraints may initially comprise all of the known constraints for the integrated circuit design. The isolated list of constraints may be updated during execution of the methods described herein.

As discussed above, an exemplary method of the present disclosure may begin by attempting 210 to prove an assertion 200 without any constraints 205. If the assertion 205 passes at 215, then no constraints 205 may be necessary and the assertion 200 being verified may be reported 265 as a "pass" without constraints. If, however, the assertion 200 fails at 215, a constraint from the constraint list 205 may be added 220 to the isolated constraint list 206. An attempt to reprove 260 the assertion 200 may then be performed, in this particular example, with the list of isolated constraints 206. The sequence of reproving 260, and updating 220 the list of isolated constraints 206 may continue until a combination of constraints is obtained, which allows the assertion to pass. If the assertion passes, a "pass" may be reported 265 along with the list of isolated constraints 206 required for the assertion to pass.

Figure 7:
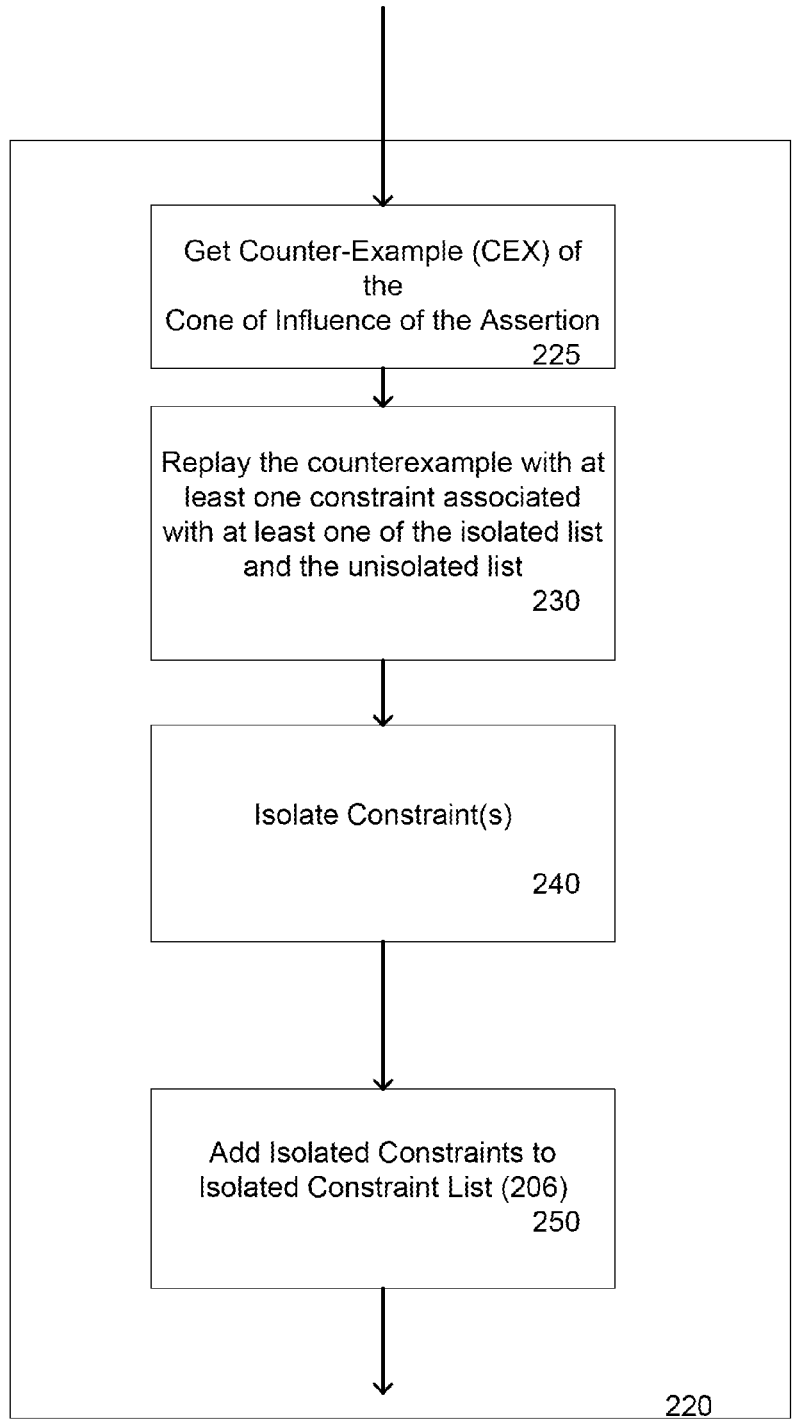
FIG. 7 is an exemplary flowchart corresponding to block 220 of FIG. 6.

Referring now to FIG. 7 an exemplary flowchart corresponding to block 220 of FIG. 6 is provided. FIG. 6 and FIG. 7, depict an exemplary method of updating 220 the list of isolated constraints 206 in further detail. Updating 220 may include obtaining 225 the counterexample of the cone of influence of the assertion, replaying 230 the counterexample with at least one constraint associated with at least one of the isolated list and the unisolated list (e.g., with remaining constraints 205 enabled), isolating 240 constraints from the list of constraints 205, and adding 250 the isolated constraints to the list of isolated constraints 206. The term "counterexample" as used herein, may refer to an example used to disprove a particular statement. In some embodiments, constraints isolated on previous iterations of the method may not enabled when replaying 230 the counterexample. However, it should be noted that when replaying the counterexample, one or more of the isolated or unisolated list may be utilized.

After updating 220 the list of isolated constraints 206, the assertion 200 may be proved again 260, this time with the list of isolated constraints 206. On each pass through logical block 220, one or more constraints may be added 250 to the list of isolated constraints 206. If the assertion passes, a "pass" may be reported along with the list of isolated constraints 206.

In some embodiments, the constraints may be used to define the design environment. These may be the same Portable Specification Language (PSL), SystemVerilog Assertions (SVA), and Open Verification Libarary (OVL) constraints that may be used to describe the environment in a particular application. Embodiments of the present disclosure may utilize a constraint solver to perform various operations. In this way, the constraint solver may use the combinational or sequential PSL, SVA, and OVL constraints as inputs and may generate simulation traces that meet those constraints. If there is a conflict between constraints during trace generation, then the simulation may reach a dead-end state and may not continue. Generally, constraints are functions over state and input variables of the design. In certain hybrid technologies, constraints may be used to define the design environment and may be solved by the constraint solver. For example, consider a case in which a constraint solver could not generate a solution for the simulation to take place. This may happen due to a conflict between constraints or between constraints and the design. In this case, the simulation may not continue from the existing state, which implies that the simulator has reached a dead-end state. There may be no possible next states in the design due to a conflict between the current design state, pin, or property constraints. In this way, deadend isolation techniques may be used to detect the constraints that are causing the conflict.

Figure 8:
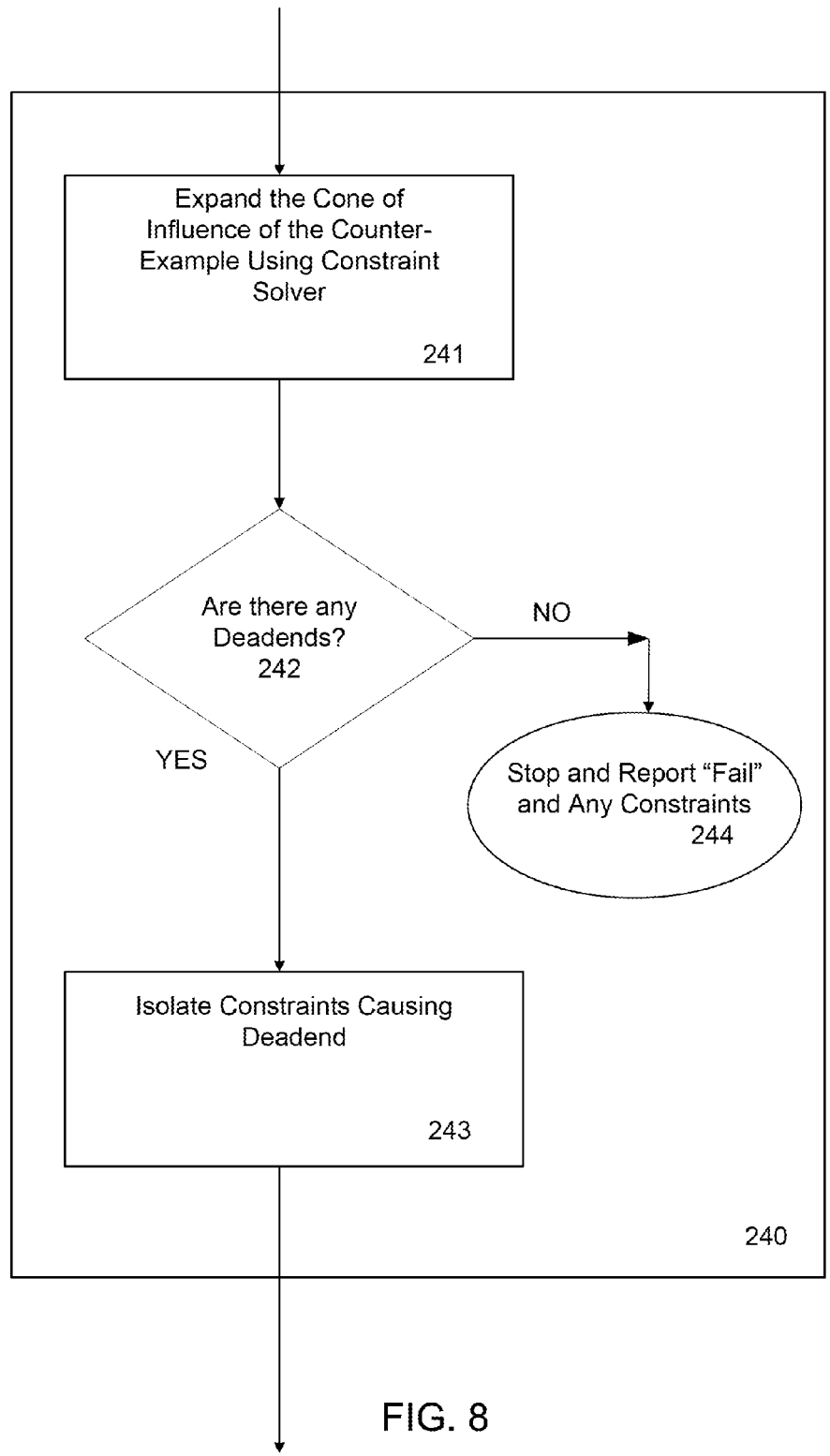
FIG. 8 is an exemplary flowchart corresponding to block 240 of FIG. 7.

Referring now to FIG. 8, an exemplary flowchart corresponding to block 240 of FIG. 7 is provided. Isolating 240 constraints may include expanding 241 the cone of influence of the counterexample using a constraint solver and determining 242 if there are any deadends. If no deadends are found the verification is stopped and "fail" may be reported 244 along with any isolated constraints. If a deadend is found, the constraints responsible for the deadend may be isolated 243 and added 250 to the list of isolated constraints (as shown in FIGS. 7-9).

If no deadends are found at 242, then the current set of remaining constraints could not be applied to cause the assertion to pass. In this case, a "fail" may be reported 244 along with any constraints that have been isolated on previous iterations of the method. This failure may be reported to the user so that he/she may debug the design and find the underlying cause of the assertion failure.

Figure 9:
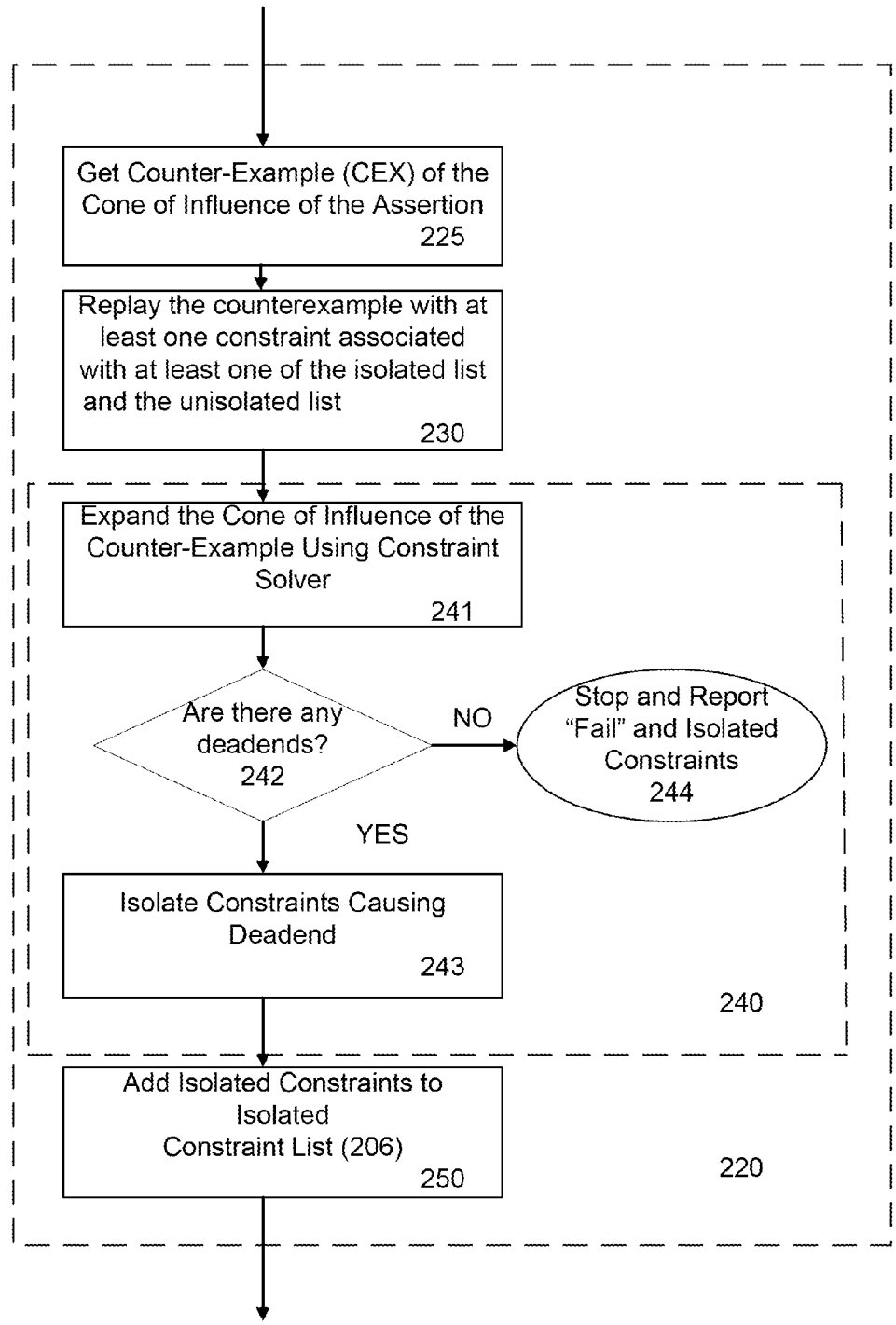
FIG. 9 is an exemplary flowchart corresponding to the combination of blocks 220 and 240 of FIG. 6 and FIG. 7 respectively.

Referring now to FIG. 9, an exemplary flowchart for the combination of blocks 220 and 240 of FIG. 7 and FIG. 8 is provided. Updating 220 a list of isolated constraints according to an embodiment of the present disclosure may include obtaining 225 the counterexample of the cone of influence of the assertion, replaying 230 the counterexample with at least one constraint associated with at least one of the isolated list and the unisolated list (e.g., replaying the counterexample with all remaining constraints enabled), isolating constraint(s) 240, and adding 250 the isolated constraint(s) to the list of isolated constraints. Isolating the constraint(s) 240 may further include expanding 241 the cone of influence of the counterexample using a constraint solver, determining 242 if there are deadends, and isolating 243 the constraint responsible for the deadend. If no deadends are found, the verification may be stopped and a "fail" may be reported 244 along with the list of isolated constraints.

Figure 10:
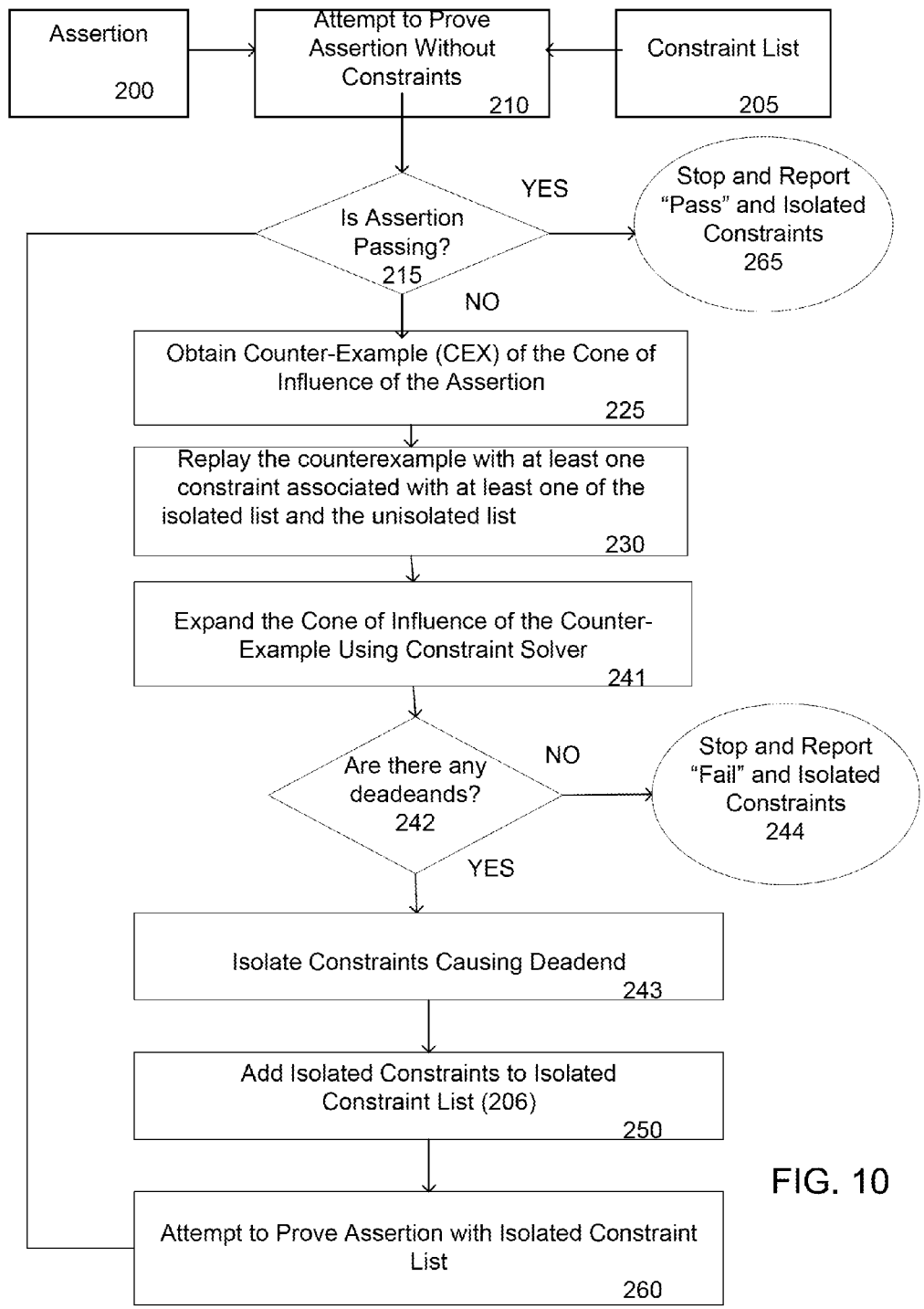
FIG. 10 is an exemplary flowchart corresponding to the combination of FIG. 6 and FIG. 9.

Referring now to FIG. 10 an exemplary flowchart depicting the combination of FIG. 6 and FIG. 9 is provided. As shown in FIG. 10, an attempt to prove an assertion 200 may be made initially with a list of constraints 205. If the assertion passes at 215, a "pass" may be reported 265. If the assertion fails at 215, the counterexample of the cone of influence of the assertion may be obtained 225. The counterexample may then be replayed 230 with at least one constraint associated with at least one of the isolated list and the unisolated list (e.g., with all constraints 205 enabled). In some embodiments, the cone of influence of the counterexample may be expanded 241 using a constraint solver. If no deadends are found at 242, the verification may be stopped and a "fail" may be reported 244 along with any constraints isolated on previous iterations of the method. If a deadend is found at 242, the constraint responsible for causing the deadend may be isolated 243 and added 250 to the list of isolated constraints 206. The assertion 200, may then be proven again 260, this time with the list of isolated constraints 206. The method may then begin a subsequent iteration by determining 215 if the assertion is passing with the list of isolated constraints.

Figure 11:
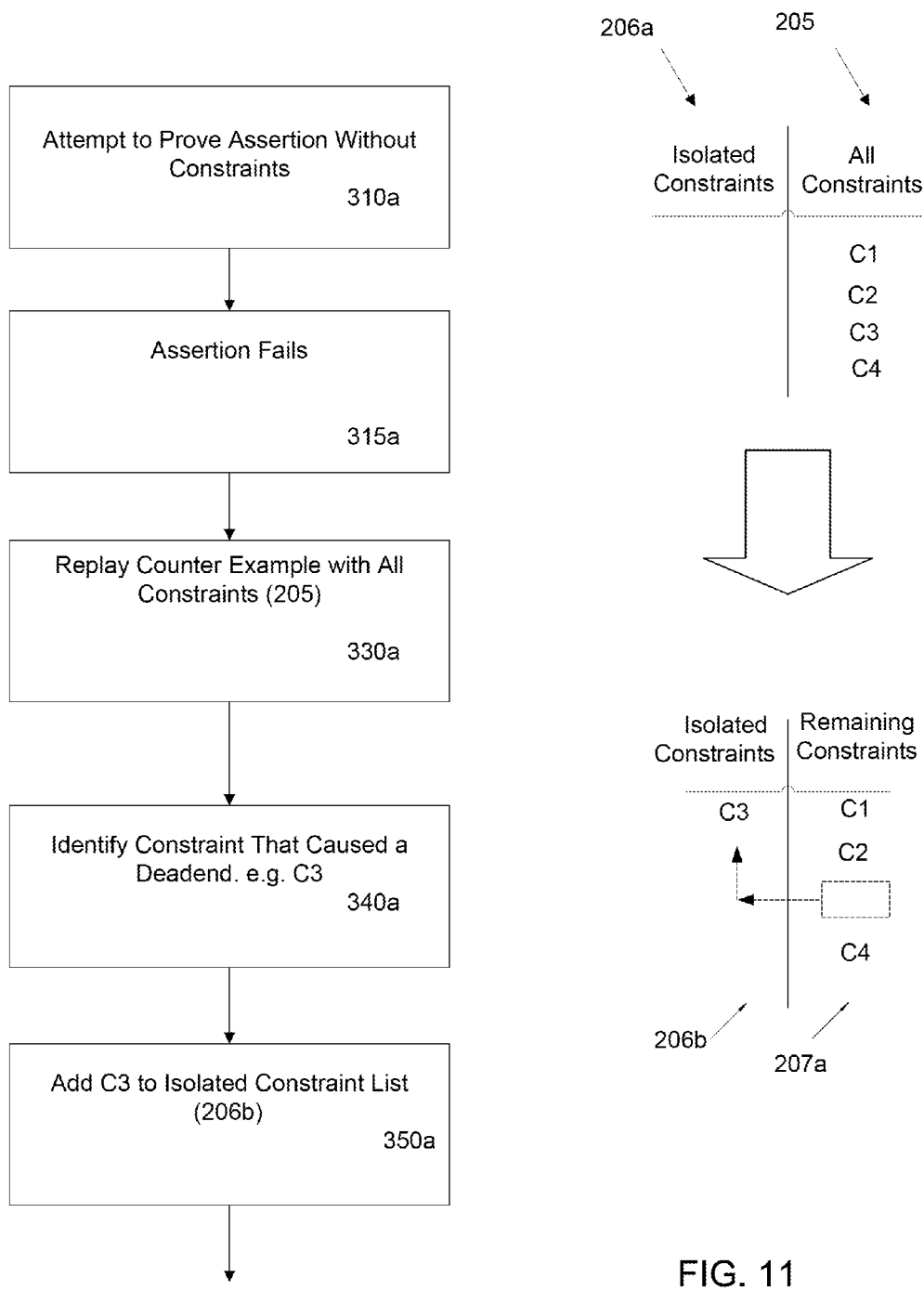
FIG. 11 is a flowchart showing an exemplary first iteration through the method shown in FIG. 10.

Referring now to FIG. 11, a flowchart showing an exemplary first iteration through the method of FIG. 10 is provided. As shown in FIG. 11, a first iteration through the method of FIG. 10 may include attempting to prove an assertion without constraints 310*a*, an assertion failure 315*a*, replaying the counterexample with all unisolated constraints 330*a*, identifying a constraint as responsible for a deadend 340*a*, and adding that constraint to a list of isolated constraints 350a. Lists 206a, 205, 206b, and 207a of isolated and remaining constraints are maintained on the right for reference.

The assertion may be initially proven 310a without constraints. Attempting to prove assertions without constraints may increase the efficiency of formal verification as significant processor time may be required to effectively enforce constraints throughout formal verification. However, in this example, the assertion has failed 315a. The circumstances leading to the assertion failure (the counterexample) may be replayed 330a with all constraints 205 enabled. The cone of influence of the counterexample may be expanded using a constraint solver until a constraint which causes a deadend is found. In this example, constraint C3 may be identified as being responsible for the deadend 340a. If no deadend causing constraint can be identified, then there may be no set of constraints which may cause the assertion to pass and the formal verification fails. Constraint C3 may then be added 350a to the list of isolated constraints 206b and removed from the list of remaining constraints 207a in preparation for the next iteration of the method.

Figure 12:
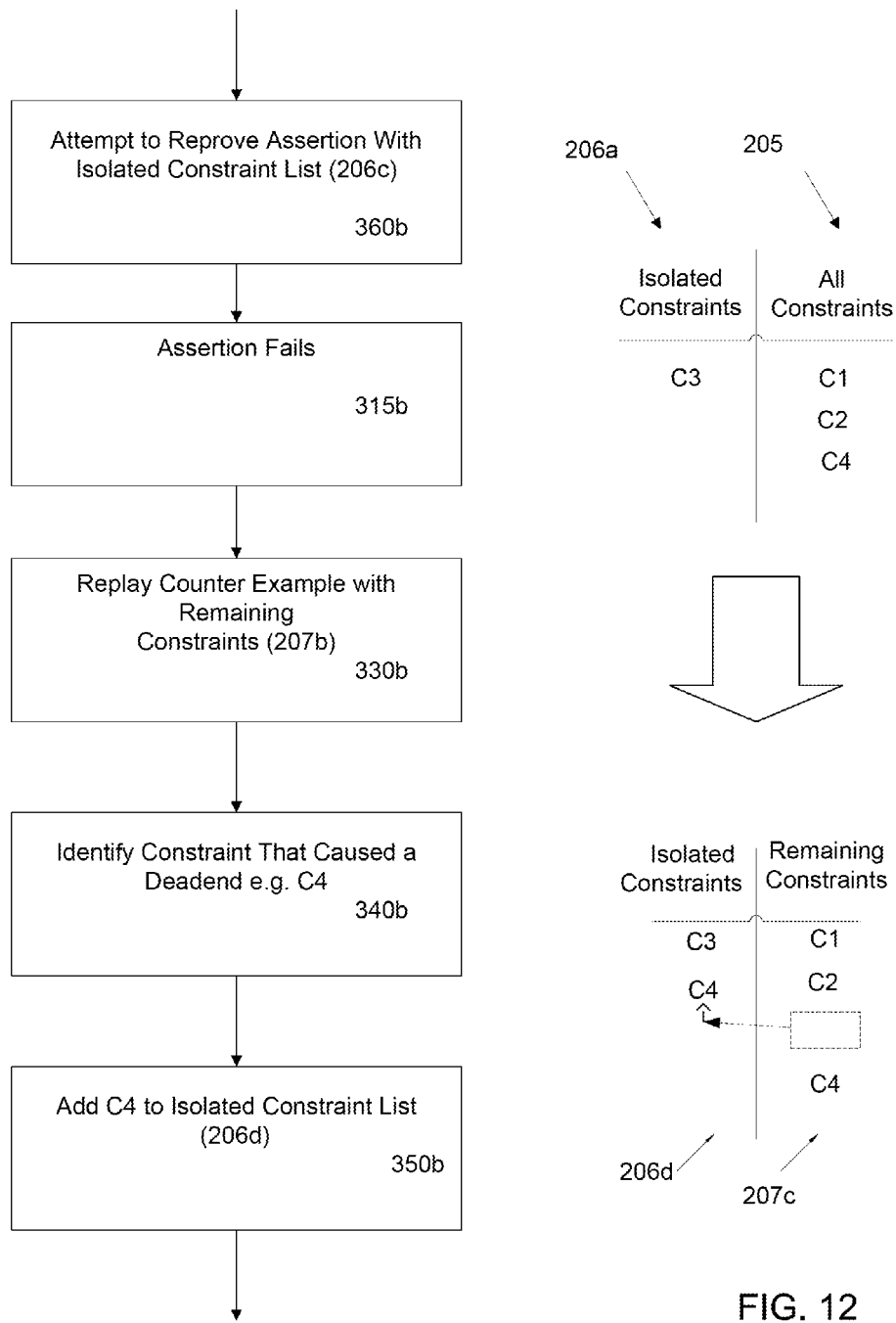
FIG. 12 is a flowchart showing an exemplary second iteration through the method shown in FIG. 10.

Referring now to FIG. 12 a flowchart showing an exemplary second iteration through the method of FIG. 11 is provided. As shown in FIG. 12, a second iteration through the method of FIG. 10 may include attempting to reprove the assertion with the isolated constraint list 360b, an assertion failure 315b, replaying the counterexample with all unisolated constraints 330b, identifying a second constraint as responsible for a deadend 340b, and adding that constraint to a list of isolated constraints 350b. Lists 206c, 207b, 206d, and 207c of isolated and remaining constraints are maintained on the right for reference.

At the beginning of the second iteration, the assertion may be proven 360b with the list of isolated constraints 206c. At this point, the list of isolated constraints may 206c contain only a single constraint, C3. However, even with constraint C3, the assertion fails 315b. The counterexample may be replayed 330b with all remaining constraints C1, C2, and C4 207b enabled. The cone of influence of the counterexample may be expanded using a constraint solver until a constraint which causes a deadend is found. In this second iteration, constraint C4 may be identified as being responsible for the deadend 340b. Constraint C4 may then be added 350b to the list of isolated constraints 206d and removed from the list of remaining constraints 207c in preparation for the next iteration of the method.

Figure 13:
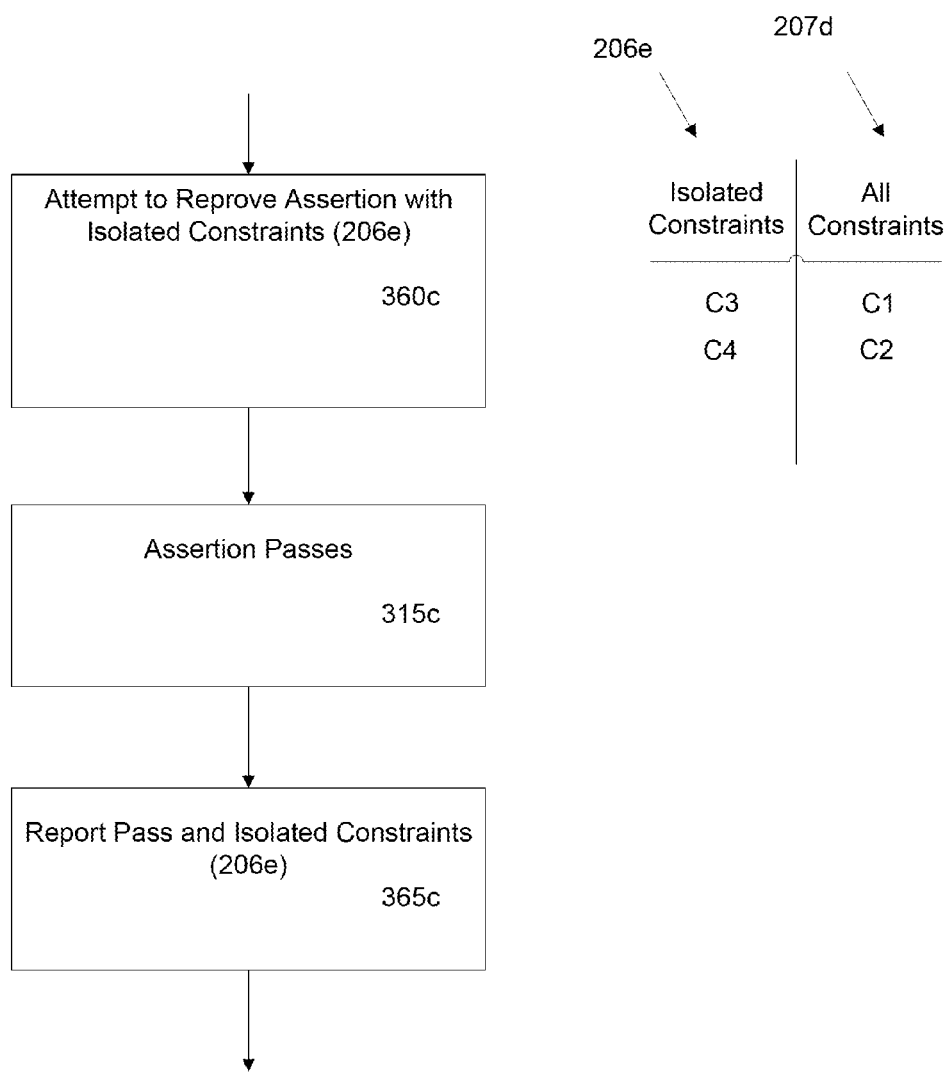
FIG. 13 is a flowchart showing an exemplary third iteration through the method shown in FIG. 10.

Referring now to FIG. 13 a flowchart showing an exemplary third iteration through the method shown in FIG. 10 is provided. As shown in FIG. 13, a third iteration through the method of FIG. 10 may include attempting to reprove 360c the assertion with the isolated constraints 206e, an assertion pass 315c, and reporting the pass 365c and isolated constraints 206e. Lists 206e and 207d of isolated and remaining constraints are maintained on the right for reference.

At the beginning of the third iteration, the assertion may be proven 360c with the list of isolated constraints 206e. At this point, the list of isolated constraints 206e may contain both C3 and C4. In this example, the assertion may pass 315c when both isolated constraints 206e C3 and C4 are enabled. The result of the formal verification may be reported 365c along with the isolated constraints 206e. It should be noted that while this example shows three iterations, various numbers of iterations may be necessary in order to perform the methods of the present disclosure.

Figure 14:
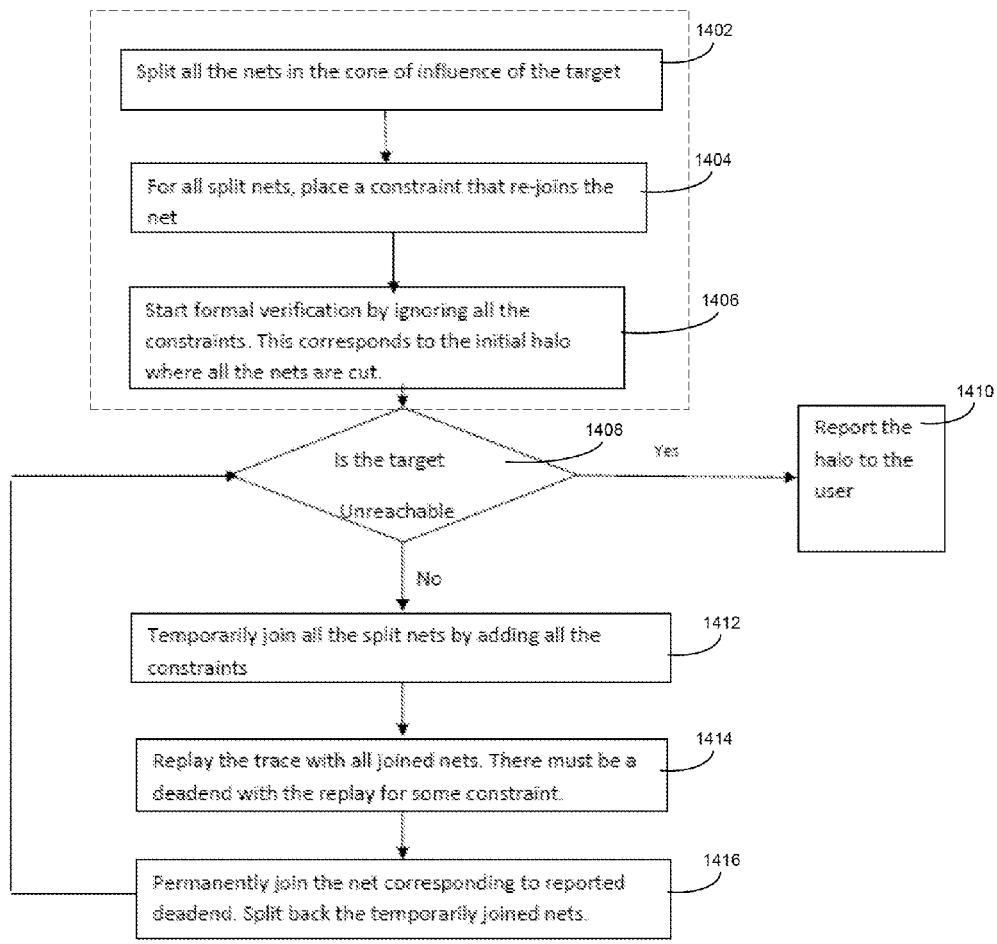
FIG. 14 is a flowchart depicting an embodiment of a debugging process consistent with the present disclosure.
Figure 15:
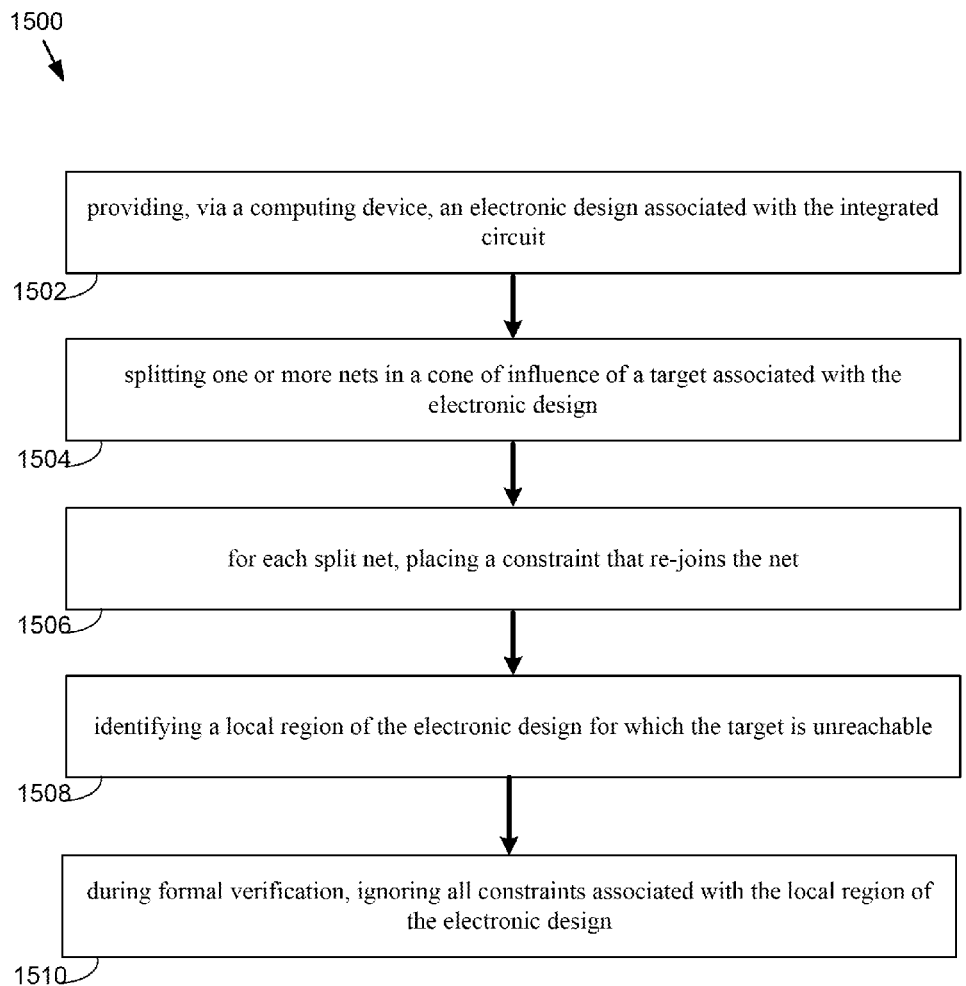
FIG. 15 is a flowchart depicting an embodiment of a debugging process consistent with the present disclosure.

Referring also to FIGS. 14-15, embodiments depicting debugging process 11 consistent with the present disclosure are provided. In some embodiments, debugging process 11 may provide a mechanism to debug the unreachable design targets detected by formal verification. Embodiments of debugging process 11 may be used in conjunction with the teachings of constraint process 10. For example, in some cases, some or all of the aspects of debugging process 11 may be employed prior to utilization of constraint minimization process 10. However, the present disclosure is not intended to be limited to this example.

Formal verification may detect whether a verification check holds true with respect to the given design and environment. Formal verification techniques may be used any suitable design, including but not limited to, verifying RTL designs for the verification checks written using PSL/SVA languages. This may involve multiple flows where the assertions are internally generated. One such flow may include automatically detecting unreachable targets in the design. Formal verification provides a unique counter-example in case a target is hit. The counter-example (e.g. trace) may include the signal transitions leading to the scenario when the target is hit. However, when any target is reported as unreachable by formal tools, the tool does not provide any debug information. In many cases, the targets are unreachable because of some design bug. To understand and fix the design bug, any information provided to the user to debug the cause would bring significant value add to the user. Accordingly, embodiments of debugging process 10 may assist the users in determining the cause associated with the target being unreachable.

Embodiments of debugging process 10 may be used to determine a smaller local region of an electronic design (e.g. a "halo") in which the target is unreachable. In some embodiments, debugging process 10 may utilize iterative formal verification runs. In this way, debugging process may start with the smallest local halo. If the target is unreachable, the halo may be reported back to the user. On the other hand, if the target is hit, the halo may be refined. In some embodiments, refining the halo may include an iterative constraint minimization technique such as those described in U.S. Pat. No. 8,316,332, which is incorporated herein by reference in its entirety. In some embodiments, debugging process 10 may continue refining the halo until the target is unreachable. Once the target becomes unreachable, the halo may be reported back to the user.

One possible example consistent with embodiments of debugging process 11 is provided below:

```
/*******************************
   module top(out, in1, in2, in3, clk);
   input [3:0] in1, in2, in3;
   input clk;
   output [3:0] out;
   wire [3:0] wire1, wire2, wire3, wire4, wire5, wire6, wire7, wire8;
   assign wire1=in1;
   assign wire2=wire1 & in2;
   assign wire3=wire2;
   assign wire4=wire3 & in3;
   assign wire5=0;
   assign wire6=wire5 & wire4;
   assign wire8=(wire2 & wire3)^(wire1 & wire4);
   assign wire7=wire6 & wire2;
   assign out=wire7 & wire8;
   // psl COV: cover {out};
   endmodule
*****************/
```

Accordingly, the iterative approach described herein may identify nets as:

Iteration 1: out
Iteration 2: wire7
Iteration 3: wire6
Iteration 4: wire5

Referring again to FIG. 14, embodiments of debugging process 11 may include splitting 1402 all of the nets in the cone of influence of the target. For example, in one particular embodiment, one option may include cutting all of the flip-flops. This would provide the local halo at the flop boundary. Additionally and/or alternatively, embodiments may include cutting combinational assignments in case the user is interested in a halo having finer level of granularity.

Debugging process 11 may further include, for all split nets, placing 1404 a constraint that re-joins the net. Formal verification may begin by ignoring 1406 all of the constraints and employing an iterative constraint minimization approach such as those discussed above. Ignoring all of the constraints may include may correspond to the initial halo where all the nets are cut, and may correspond to the initial halo of the fan-in cone. If the target is hit in the local halo, iterative constraint minimization may iteratively add constraints. The addition of a constraint may be equivalent to rejoining the split nets. In this way, the halo may be refined efficiently with the addition of required nets. At any iteration, if the target the unreachable, the verification may stop.

Debugging process 11 may then determine 1408 if the target is unreachable. If so, the halo may be reported 1410 to the user. This may constitute the minimal halo with which the target is unreachable. Since, this halo is far smaller than the full cone of influence, this would help in the debug process.

If the target is not unreachable, debugging process 11 may temporarily join 1412 all of the split nets by adding all of the constraints. Debugging process 11 may replay 1414 the trace using all of the joined nets. There may be a deadend with the replay for some constraint. Debugging process 11 may permanently join 1416 the net corresponding to the reported deadend and split back the temporarily joined nets.

In some embodiments, the final result of the iterative constraint minimization may provide a set of constraints with which the target is unreachable. It should be noted that in the penultimate iteration, the target was reachable and only in the last iteration the target became unreachable. Accordingly, the net joined in the last iteration is of interest and may be the probable cause of the unreachable target.

In some embodiments, the debugging process shown in FIG. 14 may be executed for an unreachable cover target. Since, the target is unreachable it may be mandatory that after a few iterations, the target becomes unreachable and the halo is reported to the user. The constraint minimization process discussed above may be used to automatically add required constraints for the verification using the replay technique.

Referring now to FIG. 15, an embodiment consistent with debugging process 11 is provided. Embodiments may include providing 1502, via a computing device, an electronic design associated with the integrated circuit. Embodiments may further include splitting 1504 one or more nets in a cone of influence of a target associated with the electronic design. In some embodiments, splitting one or more nets may include splitting all of the nets associated with the cone of influence. For each split net, embodiments may include placing 1506 a constraint that re-joins the net. Embodiments may also include identifying 1508 a local region of the electronic design for which the target is unreachable. During formal verification, embodiments may include ignoring 1510 all constraints associated with the local region of the electronic design.

It will be apparent to those skilled in the art that various modifications and variations can be made in the constraint minimization scheme and debugging process of embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A computer-implemented method for debugging in a formal verification of an integrated circuit comprising:
   providing, via a computing device, an electronic design associated with the integrated circuit;
   obtaining an unisolated list of constraints initially comprising all known constraints for the integrated circuit design;
   obtaining an isolated list of constraints initially comprising none of the known constraints;
   splitting one or more nets in a cone of influence of a target associated with the electronic design;
   for each split net, placing a constraint that re-joins the net;
   identifying a local region of the electronic design for which the target is unreachable; and
   during formal verification, ignoring all constraints associated with the local region of the electronic design.

2. The computer-implemented method of claim 1, further comprising:
   attempting to prove an assertion without the known constraints.

3. The computer-implemented method of claim 2, further comprising:
   determining if the assertion is valid.

4. The computer-implemented method of claim 3, further comprising:
   updating the isolated list of constraints.

5. The computer-implemented method of claim 4 further comprising:
   adding the first constraint to the isolated list to generate an updated isolated list; and
   removing the first constraint from the unisolated list.

6. The computer-implemented method of claim 5 further comprising:
   proving the assertion with the updated isolated list; and
   reporting one or more of a passing or a failing assertion.

7. The computer-implemented method of claim 4 further comprising:
   isolating additional constraints using multiple iterations of the computer-implemented method.

8. A computer-readable storage medium having stored thereon instructions, which when executed by a processor result in the following operations:
   providing, via a computing device, an electronic design associated with the integrated circuit;
   obtaining an unisolated list of constraints initially comprising all known constraints for the integrated circuit design;
   obtaining an isolated list of constraints initially comprising none of the known constraints;
   splitting one or more nets in a cone of influence of a target associated with the electronic design;
   for each split net, placing a constraint that re-joins the net;
   identifying a local region of the electronic design for which the target is unreachable; and during formal verification, ignoring all constraints associated with the local region of the electronic design.

9. The computer-readable storage medium of claim 8 wherein operations further comprise:
    attempting to prove an assertion without the known constraints.

10. The computer-readable storage medium of claim 9 wherein operations further comprise:
    determining if the assertion is valid.

11. The computer-readable storage medium of claim 10 wherein operations further comprise:
    updating the isolated list of constraints.

12. The computer-readable storage medium of claim 11 wherein operations further comprise:
    adding the first constraint to the isolated list to generate an updated isolated list; and
    removing the first constraint from the unisolated list.

13. The computer-readable storage medium of claim 12 wherein operations further comprise:
    proving the assertion with the updated isolated list; and
    reporting one or more of a passing or a failing assertion.

14. The computer-readable storage medium of claim 11 wherein operations further comprise:
    isolating additional constraints using multiple iterations of the computer-implemented method.

15. A computing system for debugging in a formal verification of an integrated circuit comprising:
    at least one processor;
    at least one memory architecture coupled with the at least one processor;
    a first software module executed by the at least one processor, wherein the first software module is configured to provide an electronic design associated with the integrated circuit;
    a second software module executed by the at least one processor, wherein the second software module is configured to obtain an unisolated list of constraints initially comprising all known constraints for the integrated circuit design;
    a third software module configured to obtain an isolated list of constraints initially comprising none of the known constraints;
    a fourth software module executed by the at least one processor, wherein the fourth software module is configured to split one or more nets in a cone of influence of a target associated with the electronic design;
    a fifth software module executed by the at least one processor, wherein the fifth software module is configured to, for each split net, place a constraint that re-joins the net;
    a sixth software module executed by the at least one processor, wherein the sixth software module is configured to identify a local region of the electronic design for which the target is unreachable; and
    a seventh software module executed by the at least one processor, wherein the seventh software module is configured to, during formal verification, ignore all constraints associated with the local region of the electronic design.

* * * * *